(12) United States Patent
Ishikawa et al.

(10) Patent No.: US 8,463,212 B2
(45) Date of Patent: Jun. 11, 2013

(54) RECEIVING APPARATUS, IMAGING APPARATUS, AND RECEIVING METHOD

(75) Inventors: Nobuyuki Ishikawa, Kanagawa (JP); Yukio Yamazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 691 days.

(21) Appl. No.: 12/699,298

(22) Filed: Feb. 3, 2010

(65) Prior Publication Data

US 2010/0208109 A1     Aug. 19, 2010

(30) Foreign Application Priority Data

Feb. 10, 2009  (JP) ................................ P2009-028821

(51) Int. Cl.
*H04B 1/28* (2006.01)
(52) U.S. Cl.
USPC ........ 455/130; 455/135; 455/256; 455/247.1; 348/255
(58) Field of Classification Search
USPC ............. 455/241.1, 130, 246, 251, 78, 183.1, 455/200.1, 246.1, 249.1, 250.1, 254, 420, 455/13.4, 69, 522, 41.1, 501, 67.16, 67.11, 455/115.1, 135, 136, 138, 151.4, 148, 213, 455/194.2, 245.1, 226.3, 341, 283, 222, 230, 455/247.1, 251.1, 256; 348/255, 659, 706, 348/678, 685, 707, 735, 647
See application file for complete search history.

(56) References Cited

U.S. PATENT DOCUMENTS

| | | | | |
|---|---|---|---|---|
| 3,813,609 A | * | 5/1974 | Wilkes et al. | 330/51 |
| 4,427,996 A | * | 1/1984 | Tamura | 348/229.1 |
| 4,572,974 A | * | 2/1986 | Frieling et al. | 326/68 |
| 4,878,245 A | * | 10/1989 | Bradley et al. | 725/104 |
| 5,940,143 A | * | 8/1999 | Igarashi et al. | 348/678 |
| 6,215,987 B1 | * | 4/2001 | Fujita | 455/127.3 |
| 6,621,649 B1 | * | 9/2003 | Jiang et al. | 360/67 |
| 2002/0153958 A1 | * | 10/2002 | Ide | 330/308 |
| 2003/0025553 A1 | * | 2/2003 | Faris | 330/51 |
| 2005/0141656 A1 | * | 6/2005 | Choi | 375/345 |
| 2007/0164822 A1 | * | 7/2007 | Murthy et al. | 330/278 |
| 2010/0074370 A1 | * | 3/2010 | Gerlach et al. | 375/316 |
| 2011/0194005 A1 | * | 8/2011 | Koizumi et al. | 348/300 |

FOREIGN PATENT DOCUMENTS

| | | | |
|---|---|---|---|
| EP | 1 873 912 | | 1/2008 |
| JP | 2008 29000 | | 2/2008 |
| WO | WO 2006/099530 | * | 9/2006 |
| WO | WO 2006 099530 | | 9/2006 |

* cited by examiner

*Primary Examiner* — Tan Trinh
(74) *Attorney, Agent, or Firm* — Frommer Lawrence & Haug LLP; William S. Frommer; Ellen Marcie Emas

(57) ABSTRACT

A receiving apparatus includes: a signal-level detecting unit detecting a signal level of an input signal; a first signal-level converting unit including amplifiers, capturing the input signal and converting a signal level of the input signal; a switching unit switching an output of a converted level signal; a switching control unit selecting a specific amplifier and controlling the switching unit to select an output signal from the selected amplifier; a band-pass filter allowing only a predetermined frequency hand in the switched signal to pass; a second signal-level converting unit converting a signal level of an output signal from the amplifier into a predetermined signal level at which S/N of a mixer is maximized; the mixer mixing the converted signal passed through the band-pass filter, and an oscillation signal to generate an intermediate frequency signal; and a demodulating unit demodulating the intermediate frequency signal.

7 Claims, 15 Drawing Sheets

OSC=150MHz

INPUT SIGNAL

OUTPUT SIGNAL

RECEIVING APPARATUS, IMAGING APPARATUS, AND RECEIVING METHOD

BACKGROUND OF THE INVENTION

1. Field of the Invention

The present invention relates to a receiving apparatus, an imaging apparatus, and a receiving method, and, more particularly to a technique for controlling a gain such that a signal level of an input signal transmitted through a communication cable is converted into a fixed level range.

2. Description of the Related Art

In the past, in a broadcasting station, plural cameras are connected to a camera control unit (hereinafter simply referred to as a control unit) via a cable for transmitting an analog signal. Video signals and sound signals captured by the cameras are transmitted to the control unit through the cable. Return signals for instruction and confirmation are transmitted from the control unit through the cable.

As the cable for connecting the cameras and the control unit, in general, a coaxial cable is used because the coaxial cable is relatively low in cost. For example, in a TRIAX system adopted in many broadcasting stations, power supply is performed and video signals, sound signals, command signals, and camera return signals are transmitted with a frequency division multiplexing wave by using one coaxial cable.

In recent years, signals of an HDTV (High Definition Television) system having a large image information amount compared with the system in the past have been spread. The coaxial cable is also used for transmission of such signals having a large image information amount. Originally, it is desirable to use an optical fiber for a signal transmission channel for transmitting an HD signal in a wide band to the control unit. However, large cost and time are necessary for installing the optical fiber. Therefore, under the present situation, replacement with the optical fiber is not advanced.

Further, in recent years, in order to improve mobility and usability, longer cable length is requested for the cable for connecting the control unit and the cameras. In this way, it is demanded to extend the distance of the existing coaxial cable and use the coaxial cable for transmission of signals having a large image information amount such as the HD signal. However, since the analog transmission system has the problems explained below, it is not easy to realize the demands.

As a first problem, as the distance of the cable is extended, a signal level falls because of an increase in a loss of the cable and an S/N value at a reception end may be deteriorated in proportion to the cable distance. As a second problem, there is a transmission loss characteristic that the signal level is attenuated as a frequency of an analog signal increases. FIG. 14 is a graph of a relation between a frequency and an attenuation amount of a signal in the coaxial cable. The abscissa indicates the frequency (MHz) and the ordinate indicates the attenuation amount (dB). In FIG. 14, an example of an attenuation characteristic obtained when the cable distance is 1 km is shown.

As it is evident from FIG. 14, the attenuation amount increases as the frequency increases. For example, when a signal of 10 MHz and a signal exceeding 100 MHz are compared, it is seen that a difference between signal levels of the signals is equal to or more than 90 dB. Therefore, a $\sqrt{f}$ (f is a frequency) cable equalizing circuit and a gain control circuit (automatic gain control (AGC)) circuit for outputting, at a fixed level, reception signals input at various levels are necessary according to the cable distance.

For example, JP-A-2008-029000 discloses a gain control circuit that switches to use plural gain amplifiers according to the level of an input signal to suppress fluctuation in a signal loss caused in a process of transmission through a communication cable and enable extension of communication cable length.

SUMMARY OF THE INVENTION

FIG. 15 is a diagram of a configuration example of a receiving apparatus having a function of switching plural gain amplifiers. A receiving apparatus 200 shown in FIG. 15 receives an OFDM signal transmitted in a TRIAX system and modulated in an OFDM (Orthogonal Frequency-Division Multiplexing) system. The receiving apparatus 200 includes a low-noise amplifier (LNA) 201, a band-pass filter (BPF) 202, an amplifier 203, a step AGC circuit 204, a frequency converting unit 210, an AGC 217, and an OFDM demodulation unit 218.

The LNA 201 selects and amplifies an input signal and outputs the input signal to the BPF 202. The BPF 202 allows only a signal in a predetermined frequency band among signals input from the low-noise amplifier 201 to pass and outputs the signal to the amplifier 203. The amplifier 203 amplifies the signal input from the BPF 202 at a predetermined amplification factor and supplies the signal to the step AGC circuit 204.

The step AGC circuit 204 is a circuit for absorbing level fluctuation in an input signal and minimizing S/N deterioration. The step AGC circuit 204 includes plural amplifiers (not shown in the figure) provided to correspond to respective ranges of a signal level of the input signal. Different gains are set in the respective amplifiers. Control for selecting an output signal of an amplifier used for the output signal is performed according to the level of a signal input thereto. Consequently, a range of the level of the input signal is compressed in a predetermined range.

The frequency converting unit 210 performs processing for converting a frequency of an input signal into a predetermined intermediate frequency. The frequency converting unit 210 includes a PLL (phase-Locked Loop) unit 211, a local oscillator 212, a mixer 213, a variable-gain amplifier 214, a SAW (Surface Acoustic Wave) filer 215, and a variable-gain amplifier 216. The AGC 217 adjusts the level of a signal input thereto such that an intermediate frequency signal input to an OFDM demodulation unit 218 at a post-stage is at a fixed level and outputs the input signal to the OFDM demodulation unit 218. Control in the AGC 217 is performed on the basis of a control signal input from the OFDM demodulation unit 218. The OFDM demodulation unit 218 demodulates and outputs an input OFDM signal.

Since the step AGC circuit 204 is provided at a pre-stage of the frequency converting unit 210 in this way, even a reception OFDM signal having large fluctuation in a signal level, which is received when the cable length is large, is converted into a signal level within a fixed range. Consequently, since deterioration in S/N can be minimized, it is possible to extend the length of a coaxial cable, which is limited for the purpose of preventing deterioration in the S/N of a signal to be transmitted, to about 1 km.

However, even when such a configuration is adopted, it is difficult to prevent deterioration in S/N due to an image signal component in the mixer 213 (see FIG. 15) during reception and an adverse effect due to fluctuation in S/N depending on an input signal level in the mixer 213.

FIGS. 16A and 16B are diagrams for explaining deterioration in S/N due to an image component. Frequency components of a signal before and after being input to the mixer 213 are shown in FIGS. 16A and 16B. The abscissa indicates a frequency (MHz) and the ordinate indicates a signal level. FIG. 16A is a diagram of a frequency band of a signal input to the mixer 213. In an example shown in FIG. 16A, a desired wave signal desired to be received has a frequency of 100 MHz and a frequency of 150 MHz is output from the local oscillator 212 (see FIG. 15) and converted into an intermediate frequency signal of 50 MHz.

As shown in FIG. 16A, a desired wave in a 100 MHz band received by the mixer 213 and an oscillation signal of 150 MHz from the local oscillator 212 are mixed. As shown in FIG. 16B, the desired wave is converted into an intermediate signal of 50 MHz. When such frequency conversion shown in FIGS. 16A and 16B is assumed, an input signal of 200 MHz shown in FIG. 16A is also included in the intermediate frequency signal of 50 MHz after the conversion as an image frequency component as shown in FIG. 16B. When the frequency conversion by the mixer 213 is performed while an included image frequency is not removed, noise included in an output signal increases by about 3 dB.

FIGS. 17 and 18 are diagrams for explaining fluctuation in output S/N that depends on an input signal level in the mixer 213. In order to facilitate explanation concerning the "fluctuation in output S/N that depends on an input signal level", first, an input and output characteristic example in a general amplifier is explained with reference to FIG. 17. In FIG. 17, the abscissa indicates an input signal level (dBm) and the ordinate indicates an output signal level (dBm). A lower area indicated by dots in the figure indicates a noise floor generated by heat noise of the amplifier itself.

It is seen that, when the level of an input signal is low, the output S/N is deteriorated by the influence of the heat noise and, when the level of an input signal is high, the output S/N is deteriorated because distortion occurs in an output signal affected by the influence of third-order inter-modulation distortion.

FIG. 18 is a graph of an output S/N characteristic example in the general amplifier. The abscissa indicates a level (dBm) of an input signal and the ordinate indicates output S/N (dBc). FIG. 18 indicates that, when the input signal level is near −21 dBm, a dynamic range is the maximum and, when the input signal level is higher than −21 dBm, the output S/N is suddenly deteriorated. FIG. 19 is a graph of an output S/N characteristic in the mixer 213. FIG. 19 indicates that, in the mixer 213, when an input signal level is near −15 dBm, a maximum dynamic range is obtained and that a curve indicating an output S/N characteristic is steeper than that in the amplifier.

FIG. 20 is a graph in which the output S/N characteristic in the amplifier and the output S/N characteristic in the mixer 213 are shown in a superimposed manner. In FIG. 20, to facilitate explanation, it is assumed that the gain of the amplifier and the gain of the mixer 213 are the same. Specifically, the output S/N characteristic of the amplifier indicated by a broken line in FIG. 20 is obtained by translating an actual characteristic in the right direction on the graph. FIG. 20 indicates that, in sections indicated by arrows in the figure, the output S/N characteristic of the mixer 213 is inferior to the output S/N characteristic of the amplifier. In other words, it is seen that the output S/N characteristic of the mixer 213 has a larger influence on the S/N of a signal. Therefore, even when level fluctuation in the signal is absorbed by the step AGC circuit 204 (see FIG. 15), depending on the level of the signal, the S/N of the signal is deteriorated when the signal passes the mixer 213.

Therefore, it is desirable to suppress fluctuation in a signal loss that occurs in a process of transmitting a signal through a communication cable and extend the length of the communication cable.

A receiving apparatus according to an embodiment of the present invention includes a signal-level detecting unit that detects a signal level of an input signal transmitted through a communication cable. The receiving apparatus also includes a first signal-level converting unit including plural amplifiers that are provided for respective predetermined signal level areas obtained by dividing a signal level range of the input signal and in which a gain for converting input signals in the signal level areas into a fixed level range is set. The receiving apparatus also includes a switching unit that is provided to correspond to the plural amplifiers and switches an output of a signal, a level of which is converted by the plural amplifiers, and a switching control unit that selects a specific amplifier out of the plural amplifiers on the basis of the signal level of the input signal detected by the signal-level detecting unit. The receiving apparatus also includes a band-pass filter that allows only a predetermined frequency band in the signal, the output of which is switched by the switching unit, to pass and a second signal-level converting unit that converts a signal level of an output signal from the amplifier into a predetermined signal level. Further, the receiving apparatus includes a mixer that mixes the signal having passed through the band-pass filter, the signal level of which is converted by the second signal-level converting unit, and a local oscillation signal generated by a local oscillator to generate an intermediate frequency signal and a demodulating unit that demodulates the intermediate frequency signal generated by the mixer.

Consequently, first, the level of the input signal is converted into the fixed level range by the first signal-level converting unit and then the signal level is further converted into the predetermined level by the second signal-level converting unit. The signal band-limited in this way and having passed through the band-pass filter is input to the mixer. The intermediate frequency signal generated by the mixer is demodulated.

According to the embodiment of the present invention, since the signal is input to the mixer after the signal level is converted into the predetermined level by the first signal-level converting unit and the second signal-level converting unit, the S/N of the signal demodulated by the demodulating unit is improved. Therefore, fluctuation in a signal loss that occurs in a process of transmitting the signal through the communication cable is suppressed and the length of the communication cable can be extended.

In this case, since a signal in an unnecessary frequency band is removed by the band-pass filter, the S/N of the signal input to the demodulating unit is also improved and a quality of a reception signal (a demodulated signal) as a signal after the demodulation is improved.

DESCRIPTION OF THE PREFERRED EMBODIMENTS

A best mode for carrying of the present invention (hereinafter referred to as embodiment) is explained below. A receiving apparatus according to the embodiment of the present invention is applied to a receiving apparatus used in a broadcast signal transmission system.

Figure 1:
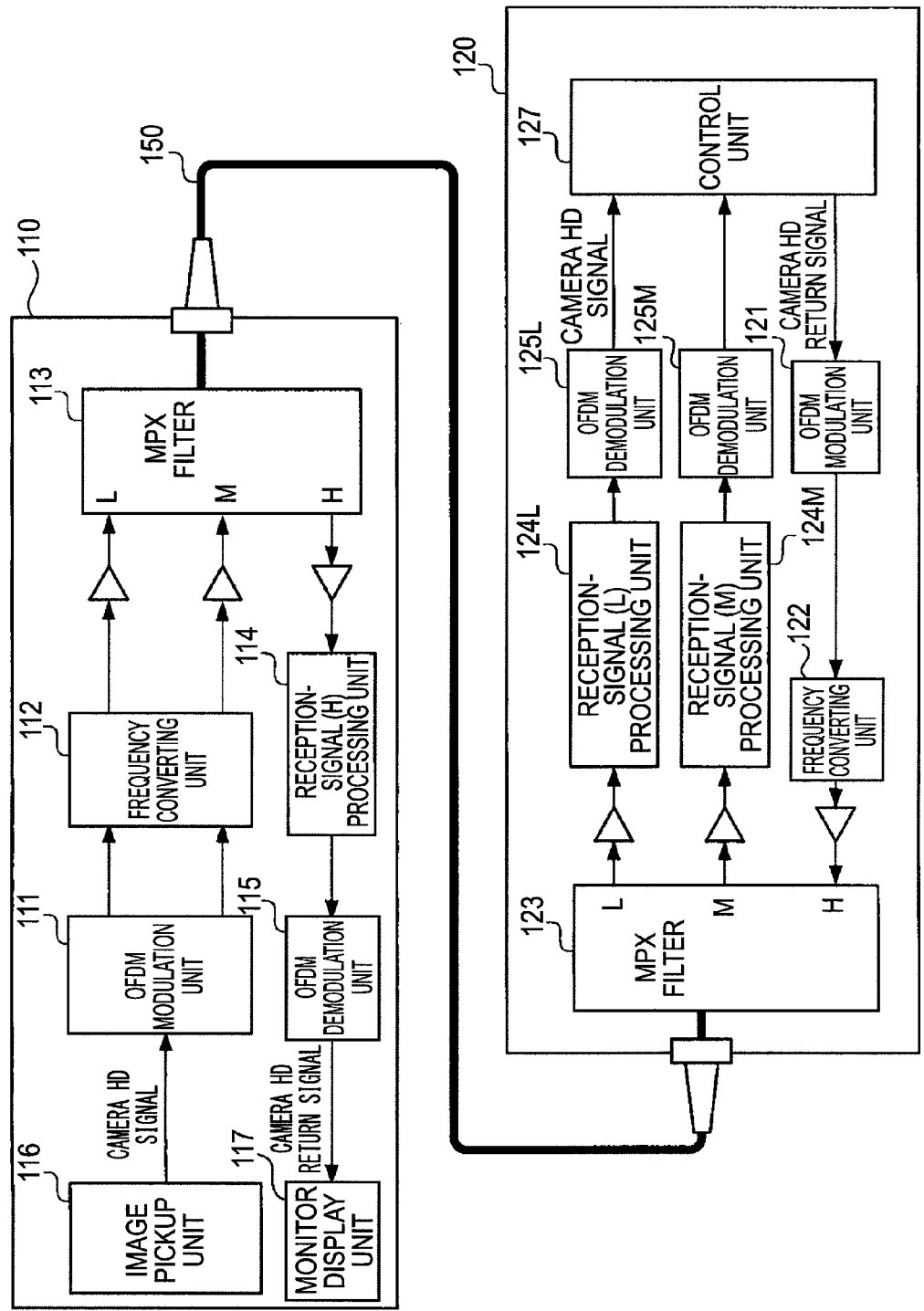
FIG. 1 is a block diagram of a configuration example of an image signal transmission system according to an embodiment of the present invention.

The explanation is performed in the order described below.
1. Overall configuration example of the broadcast signal transmission system
2. Configuration example of a step AGC circuit
3. Configuration example of an AGC provided at a post-stage of the step AGC circuit
4. Effects of the embodiment
5. Modifications Overall Configuration Example of the Broadcast Signal Transmission System FIG. 1 is a diagram of the configuration of the broadcast signal transmission system according to this embodiment. In the broadcast signal transmission system according to this embodiment, an imaging apparatus (hereinafter referred to as a camera) 110 for broadcast and a control apparatus 120 are connected via a TRIAX cable 150.

A camera HD signal or the like is transmitted from the camera 110. A camera HD return signal or the like for checking with the camera 110, an image photographed by the camera 110 is transmitted from the control apparatus 120. The signal transmitted by one apparatus is input to the other apparatus through the TRIAX cable 150.

The camera HD signal and the camera HD return signal are subjected to OFDM modulation of 64 QAM (Quadrature Amplitude Modulation) and allocated to an OFDM signal, a frequency band of one wave of which is 8 MHz.

The camera 110 includes an OFDM modulation unit 111, a frequency converting unit 112, an MPX filter 113, a reception-signal (H) processing unit 114, an OFDM demodulation unit 115, an imaging unit 116, and a monitor display unit 117.

The OFDM modulation unit 111 applies the OFDM modulation to a camera HD signal generated by the imaging unit 116 and generates plural OFDM signals. As the OFDM signals, three groups of a group L, a group M, and a group H are generated in order from one having a lowest frequency band. The camera HD signal transmitted from the camera 110 is allocated to the OFDM signals of the group L and the group M among the three groups.

Details of the OFDM signals of the group L, the group M, and the group H are explained later with reference to FIG. 2.

The frequency converting unit 112 converts the OFDM signals generated by the OFDM modulation unit 111 into a predetermined transmission frequency. The frequency converting unit 112 outputs the transmission OFDM signals of the group L and the group M to the MPX filter 113. The MPX filter 113 is a filter that separates an input signal into frequency bands of the group L, the group M, and the group H. The group L and the group M are set for transmission and the group H is set for reception.

Therefore, the MPX filter 113 transmits the OFDM signals of the group L and the group M separated by the MPX filter 113 to the TRIAX cable 150 and outputs the OFDM signal of the group H input through the TRIAX cable 150 to the reception-signal (H) processing unit 114. Details of the reception-signal (H) processing unit 114 are explained later.

The OFDM demodulation unit 115 demodulates the camera HD return signal from the OFDM signals. The imaging unit 116 generates a camera HD signal based on a photographed video signal. The monitor display unit 117 reproduces and displays the camera HD return signal.

The control apparatus 120 includes an OFDM modulation unit 121, a frequency converting unit 122, an MPX filter 123, a reception-signal (L) processing unit 124L, a reception-signal (M) processing unit 124M, an OFDM demodulation unit 125L, an OFDM demodulation unit 125M, and a control unit 127.

The OFDM modulation unit 121 applies the OFDM modulation to the camera HD return signal generated by the control unit 127 and generates the OFDM signal of the group H. The frequency converting unit 122 converts the OFDM signal generated by the OFDM modulation unit 121 into a predetermined transmission frequency band and generates a transmission OFDM signal.

The MPX filter 123 is a filter that separates the group L, the group M, and the group H. The group L and the group M are set for reception and the group H is set for transmission. Therefore, the MPX filter 123 outputs the OFDM signals of the group L and the group M separated by the MPX filter 123 to the reception-signal (L) processing unit 124L and the reception-signal (M) processing unit 124M, respectively. The MPX filter 123 transmits the OFDM signal of the group H to the TRIAX cable 150.

The OFDM demodulation unit 125L and the OFDM demodulation unit 125M demodulate the camera HD signal from the OFDM signals. The control unit 127 captures the camera HD signal and generates the camera HD return signal from the camera HD signal.

The OFDM signals are explained below.

Figure 2:
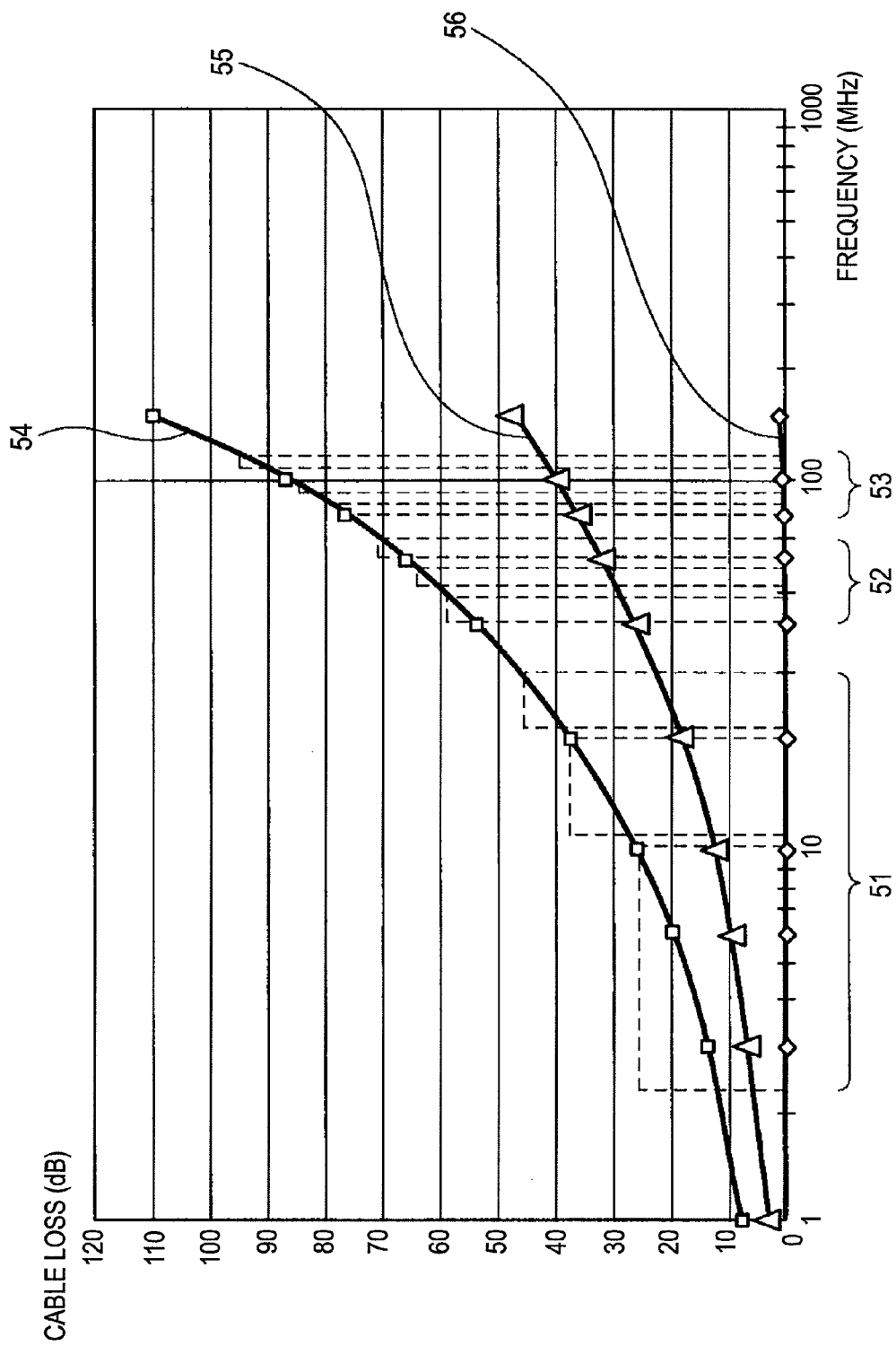
FIG. 2 is a graph of OFDM signals and cable loss characteristics in the embodiment.

FIG. 2 is a graph of OFDM signals and cable loss characteristics applied to this embodiment.

In this embodiment, three carriers arranged at a minimum interval in the OFDM modulation are collectively allocated to one group. Spaces are set among groups. The groups are represented as group L51, group M52, and group H53 in order from one having a lowest frequency. A camera HD signal and a return signal are allocated to each of the groups.

Chain lines in the figure indicate frequency bands of one wave of the OFDM signals. Three OFDM signals having lower frequencies belong to the group L51. Similarly, three OFDM signals having intermediate frequencies belong to the group M52 and three OFDM signals having higher frequencies belong to the group H53.

The camera 110 transmits the HD signal to the control apparatus 120 using frequency bands of the group L51 and the group M52. The control apparatus 120 transmits the return signal to the camera 110 using a frequency band of the group H53.

Since the OFDM signals are used in this way, a reception side only has to apply simple level control to OFDM waves independent from one another. Therefore, the cable equalizing circuit necessary in the past is unnecessary and a reduction in cost of a transmitting apparatus can be realized. Since the OFDM signals are digital signals, there is an advantage that the same signal quality is obtained in both a maximum cable extension point (a demodulation limit point) and a near distance point as long as a received C/N value is within a demodulation range.

In FIG. 2, the abscissa indicates a frequency and the ordinate indicates a cable loss. A loss characteristic 54 obtained when cable length is 1 km, a loss characteristic 55 obtained when the cable length is 500 m, and a loss characteristic 56 obtained when the cable length is 10 m are shown in the figure. As it is evident from FIG. 2, as the frequency is higher, an attenuation amount of a signal is larger. A fluctuation amount of a signal level of the signal is larger as the cable length is larger.

In this embodiment, even a reception OFDM signal having large fluctuation in a signal level in this way, which is received when the cable length is large, is converted into a signal level within a fixed range by using the step AGC circuit.

The reception-signal (H) processing unit 114, the reception-signal (M) processing unit 124M, and the reception-signal (L) processing unit 124L including such a step AGC circuit are explained below with reference to FIG. 3. In the following explanation, since the reception-signal (L) processing unit 124L and the reception-signal (M) processing unit 124M have the same structure, the reception-signal (L) processing unit 124L and the reception-signal (M) processing unit 124M are collectively referred to as reception-signal processing unit 124. Similarly, the OFDM demodulation unit 125L and the OFDM demodulation unit 125M are collectively referred to as OFDM demodulation unit 125.

Figure 3:
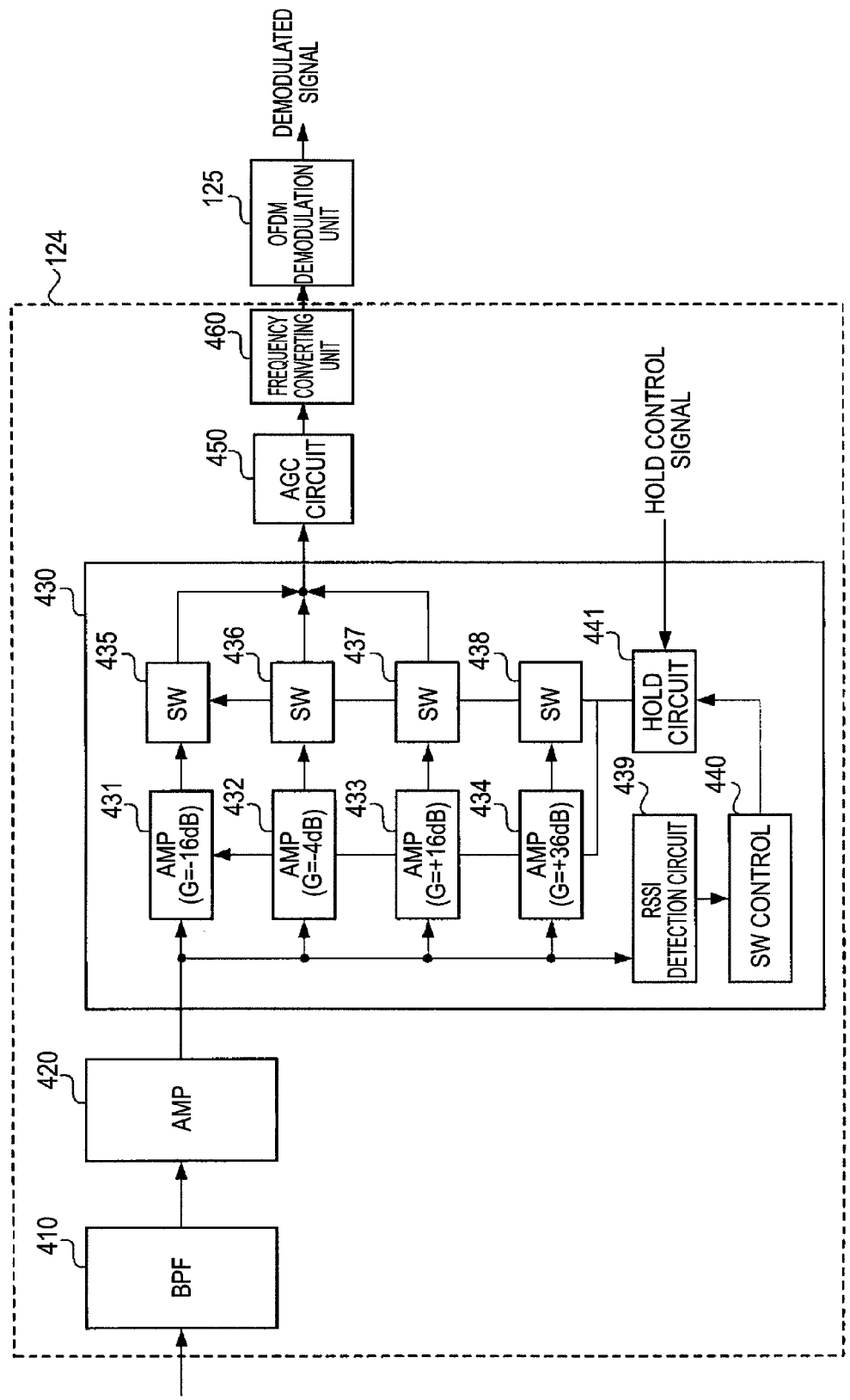
FIG. 3 is a block diagram of a configuration example of a reception-signal processing unit according to the embodiment.

FIG. 3 is a block diagram of a configuration example of a reception-signal processing unit in which a signal area for a reception signal is divided into four. An example on the control apparatus 120 side is shown in FIG. 3.

The reception-signal processing unit 124 includes a BPF 410, a step AGC circuit 430, an AGC 450, and a frequency converting unit 460.

The BPF 410 further separates, wave by wave, one group of the OFDM signals separated from the MPX filter 123 (see FIG. 1). The AMP 420 performs adjustment of gains of the OFDM signals separated by the BPF 410. The step AGC circuit 430 subjects a reception signal output from the BPF 410 to level conversion according to a signal level and compresses level fluctuation in the reception signal.

The AGC 450 converts the level of the signal output from the step AGC circuit 430 into −15 dBm at which best output S/N of the mixer in the frequency converting unit 460 is obtained and outputs the signal to the mixer. In this embodiment, it is assumed that the gain of the mixer is fixed to 0 dB.

The frequency converting unit 460 frequency-converts the output signal of the step AGC circuit 430 into a demodulated band.

Configuration Example of the Step AGC Circuit

The step AGC circuit 430 is explained below. The step AGC circuit 430 includes an amplifier (hereinafter referred to as an AMP) 431, an AMP 432, an AMP 433, and an AMP 434 and a switch (hereinafter referred to as an SW) 435, an SW 436, an SW 437, and an SW 438. The amplifiers include an amplifier that operates as an attenuator, the gain of which is minus.

The step AGC circuit 430 includes an RSSI (Received Signal Strength Indicator) detection circuit 439 as a signal-level detecting circuit, an SW control unit 440 as a switching control circuit, and a hold circuit 441.

The AMP 431, the AMP 432, the AMP 433, and the AMP 434 are connected in parallel with respect to an input signal input from the BPF 410. The AMP 431, the AMP 432, the AMP 433, and the AMP 434 convert the input signal with gains respectively set therein and output the input signal. In this embodiment, as explained above, signal level fluctuation of the input signal that occurs when the coaxial cable is extended to about 1 km is compressed to the fixed level range.

Figure 4:
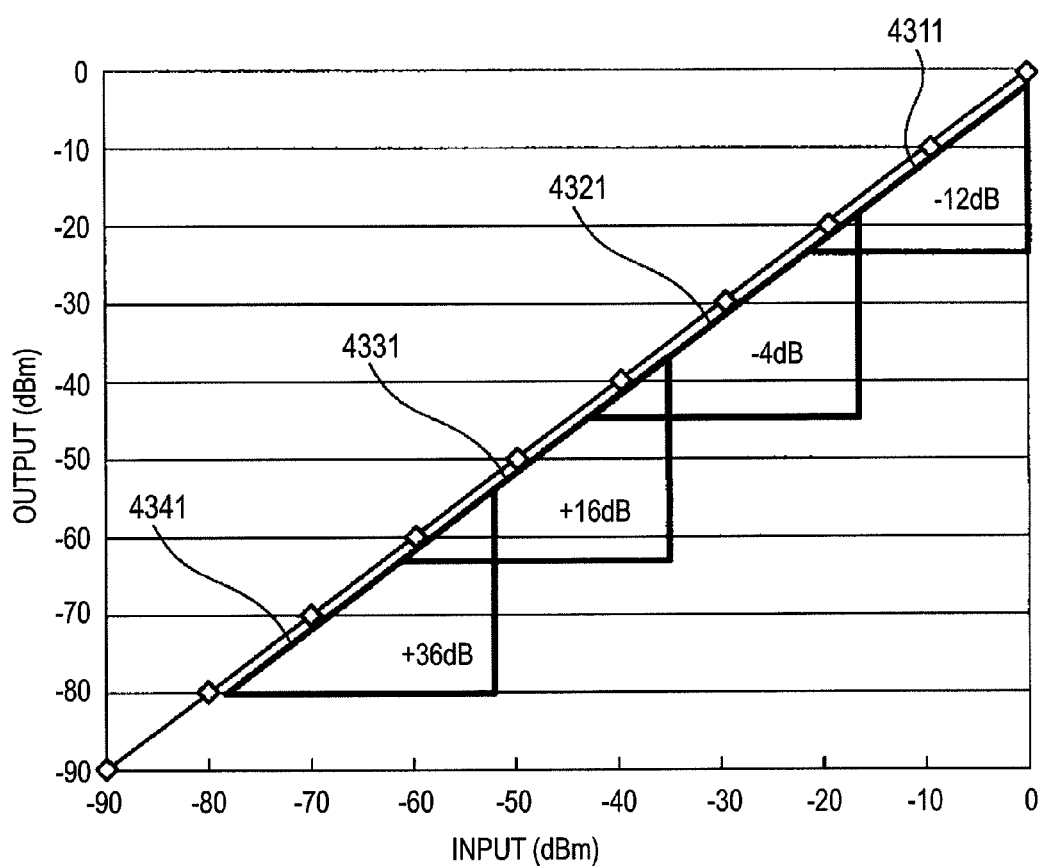
FIG. 4 is a graph of an example of gain setting for each amplifier in a step AGC circuit according to the embodiment.

Gain setting of the step AGC circuit 430 is explained below. FIG. 4 is a graph of an example of gain setting performed when the signal level area is divided into four.

An example of gains respectively set in the AMP 431, the AMP 432, and the AMP 433 is shown in FIG. 4. The step AGC circuit 430 in this example divides the signal level area into four according to an attenuation amount of a signal level of an input signal.

The divided signal level areas include a shortest distance level 4311 in which a distance of a cable is extremely short and an attenuation amount is the smallest, a short distance level 4321 in which the distance of the cable is longer than the shortest distance and the attenuation amount is larger, an intermediate distance level 4331 in which the distance of the cable is an intermediate distance and the attenuation amount is still larger, and a long distance level 4341 in which the distance of the cable is long and the attenuation mount is the largest.

The AMP 431 is allocated to the shortest distance level 4311, the AMP 432 is allocated to the short distance level 4321, the AMP 433 is allocated to the intermediate distance level 4331, and the AMP 434 is allocated to the long distance level 4341. The gain of the AMP 431 is set to −12 dB. The AMP 431 reduces an input signal level of the shortest distance level 4311 (an attenuation of a signal level is about −5 dBm to −15 dBm) by 12 dB.

The gain of the AMP 432 is set to −4 dB. The AMP 432 reduces an input signal level of the short distance level 4321 (an attenuation amount of a signal level is about −15 dBm to −35 dBm) by 4 dB. The gain of the AMP 433 is set to +16 dB. The AMP 433 increases an input signal level of the intermediate distance level 4331 (an attenuation amount of a signal level is about −35 dBm to −55 dBm) by 16 dB. The gain of the AMP 434 is set to +36 dB. The AMP 434 increases an input signal level of the long distance level 4341 (an attenuation amount of a signal level is −55 dBm to −75 dBm) by 36 dB.

The SW 435, the SW 436, the SW 437, and SW 438 perform, according to an SW control signal input via the hold circuit 441, switching control to output a converted output of a selected AMP to the AGC 450. For example, when the input signal is within the shortest distance level 4311 in which the attenuation amount is the smallest, the AMP 431 (G=−12 dB) and the SW 435 are turned on and the other amplifiers and switches are turned off. When the input signal is within the short distance level 4321, the AMP 432 (G=−4 dB) and the SW 436 are turned on and the other amplifiers and switches are turned off.

When the input signal is within the intermediate distance level 4331, the AMP 432 (G=16 dB) and the SW 437 are turned on and the other amplifiers and switches are turned off. When the input signal is within the long distance level 4341, the AMP 433 (G=40 dB) and the SW 437 are turned on and the other amplifiers and switches are turned off. In this way, any one of the AMPs connected in parallel and the SW connected in series to the AMP are selected according to the input signal level.

The RSSI detection circuit 439 outputs an RSSI voltage signal corresponding to a signal level (−75 dBm to −5 dBm) of the input signal.

The SW control unit 440 selects, according to the RSSI voltage signal of the RSSI detection circuit 439, an AMP optimum for converting the level of the input signal into a fixed level range. Specifically, the SW control unit 440 generates an SW control signal for controlling switching of the AMPs and outputs the SW control signal to the hold circuit 441.

The hold circuit 441 selects, according to a hold control signal input from the outside, whether the SW control signal input from the SW control unit 440 should be transmitted to the AMPs and the SWs. When an instruction for fixing an AMP currently selected by instruction button operation or the like is input from the outside such as a user, the hold control signal is set to "hold". When the hold control signal is "hold", the hold circuit 441 does not transfer the SW control signal input from the SW control unit 440.

Consequently, a switching state of the AMP 431, the AMP 432, the AMP 433, and the AMP 434 and the SW 435, the SW 436, the SW 437, and the SW 438 is not changed and an immediately preceding switching state is continued. When the hold control signal is set to "not hold", the hold circuit 441 transfers the SW control signal input from the SW control unit 440 to the AMP 431, the AMP 432, the AMP 433, and the AMP 434 and the SW 435, the SW 436, the SW 437, and the SW 438. Consequently, an AMP to be used is selected anew on the basis of an SW control signal input from the SW control unit 440.

The fixing of the switching state by the hold circuit 441 is performed for the purpose of, for example, preventing signal interruption caused by switching of the AMPs. The switching of the AMPs is performed according to occurrence of switch changeover due to attenuation amount fluctuation in a signal level caused by a temperature change or the like of the cable and fluctuation in a detection signal of the RSSI detection circuit 439 caused by an interference signal such as interference or jump-in.

If such switching is performed during an actual broadcast, an image is interrupted a moment.

Therefore, the switching state is fixed by the hold circuit 441 when the AMPs are switched at the start of the actual broadcast. This makes it possible to prevent occurrence of a problem such as momentary interruption of the image during the actual broadcast.

Figure 5:
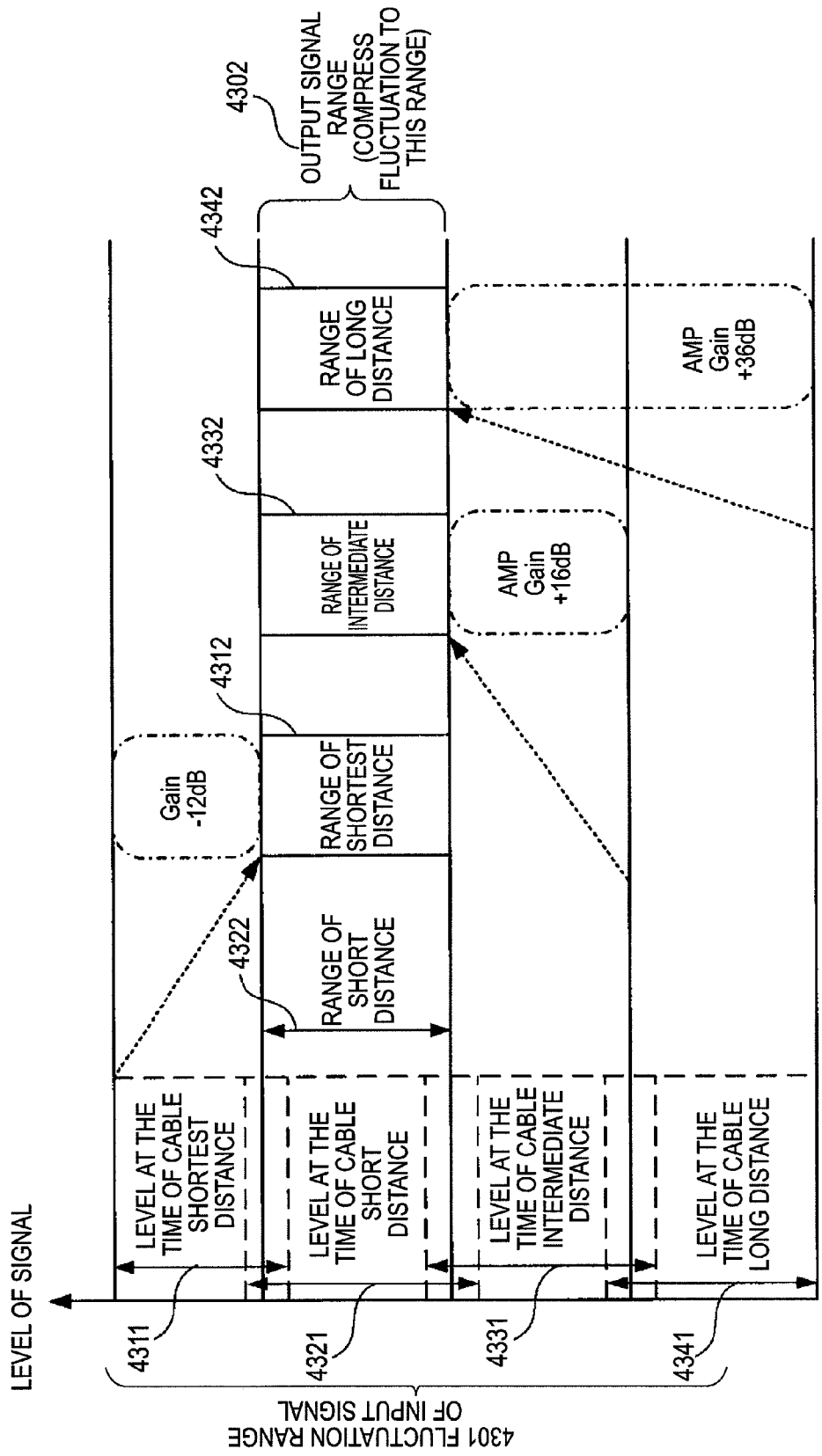
FIG. 5 is a diagram of input and output characteristics of the step AGC circuit according to the embodiment.

FIG. 5 is a diagram of level changes in an input signal and an output signal by the step AGC circuit in this example. A fluctuation range of the input signal on the ordinate indicates the level range of the input signal (the abscissa) shown in FIG. 4. An output signal range 4302 indicates a level range of the output signal after being converted by the step AGC circuit 430.

As shown in the figure, the fluctuation range of the input signal includes the shortest distance level 4311 in which the signal level is the largest, the short distance level 4321, the intermediate distance level 4331, and the long distance level 4341. Overlaps are secured in the respective level areas. Since the level 4321 at the time of the cable short distance is set as a reference, the output signal range 4302 is within the range of the level 4321 at the time of the cable short distance.

When the input signal level is within the level 4321 at the time of the cable short distance, the input signal is directly converted into the short distance range 4322. When the input signal level is within the shortest distance level 4311, the input signal is attenuated at a gain of −12 dB and converted into the shortest distance range 4312 in the output signal range 4302.

When the input signal level is within the intermediate distance level 4331, the input signal is amplified at a gain of 16 dB and converted into the intermediate distance range 4332 in the output signal range 4302. When the input signal level is within the long distance level 4341, the input signal is amplified at a gain of +36 dB and converted into the long distance range 4342 in the output signal range 4302.

In this way, the signal levels of the signal level areas obtained by dividing the fluctuation range of the input signal into four are converted and compressed to the output signal range 4302.

Any one of the AMP 431 to the AMP 434 is selectively applied in this way. This makes it possible to compress a signal level of a reception signal from the input signal range 4301 (−75 dBm to −5 dBm) to the output signal range 4302 (−39 dBm to −17 dBm).

The configuration shown in FIG. 5 is only an example. The number of AMPs to be set and gains are set as appropriate. The hold circuit 441 controls, according to a hold control signal, propriety of a change of a switching state by the SW 435, the SW 436, the SW 437, and the SW 438.

Configuration Example of the AGC at the Post-Stage of the Step AGC Circuit

A configuration example of the AGC 450 at the post-stage of the step AGC circuit 430 is explained below with reference to FIGS. 6 to 10. The AGC 450 in this example supplies a signal, which is input from the step AGC circuit 430, to the frequency converting unit 460 after fixing the level of the signal to a predetermined level and removing an image frequency included in the reception signal.

Figure 6:
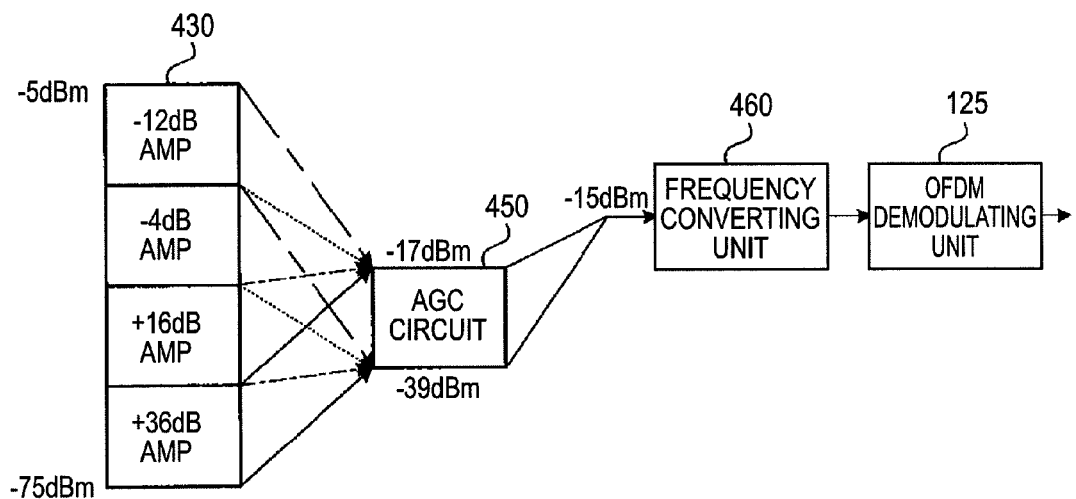
FIG. 6 is a diagram of a configuration example of the step AGC circuit and an AGC according to the embodiment.

First, processing for fixing a signal level in the AGC 450 is explained. FIG. 6 is a schematic diagram of the signal level fixing processing in the AGC 450. A signal of −30 dBm to 0 dBm, a band of which is compressed by the STEP AGC circuit 430, is input to the AGC 450. The AGC 450 fixes (converts) the level of the input signal to −15 dBm and outputs the signal to the frequency converting unit 460.

Figure 7:
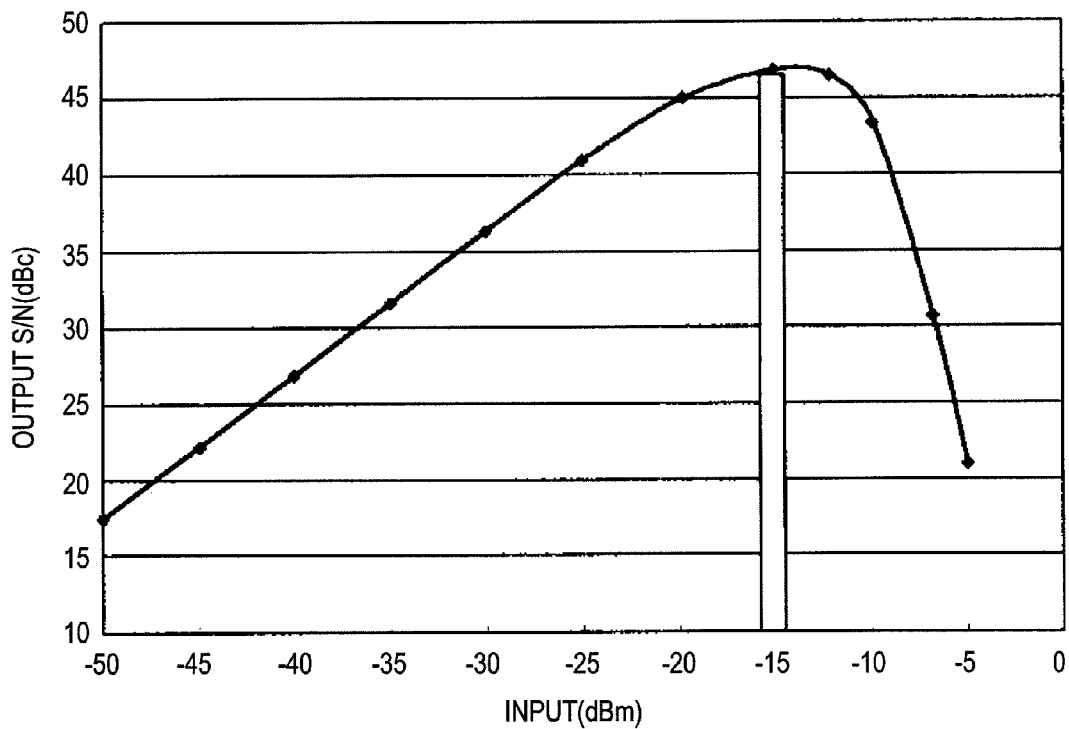
FIG. 7 is a graph of an example of an output S/N characteristic of a mixer according to the embodiment.

−15 dBm is a level at which a maximum value of output S/N of the mixer (not shown in the figure) in the frequency converting unit 460 is obtained. The value depends on an output S/N characteristic of the mixer. FIG. 7 is a graph of the output S/N characteristic of the mixer. The abscissa indicates a level (dBm) of an input signal and the ordinate indicates output S/N (dBc). It is seen that, in FIG. 7, a maximum dynamic range is obtained near the input signal level of −15 dBm of the mixer.

The AGC 450 in this example typically supplies a signal of −15 dBm to the mixer having such a characteristic.

Figure 8:
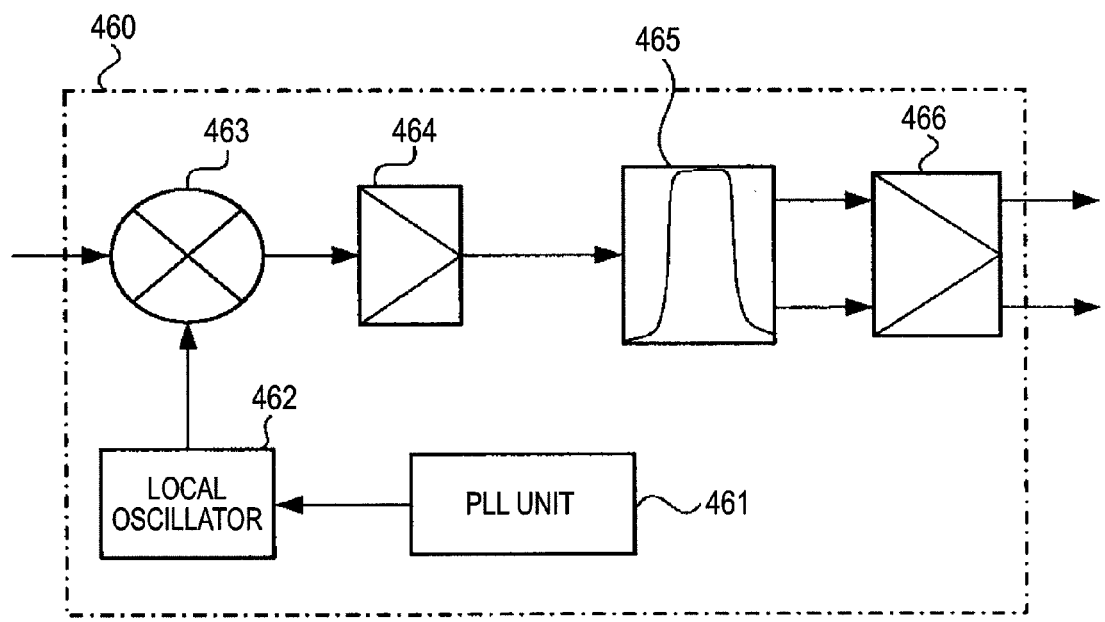
FIG. 8 is a block diagram of an internal configuration example of a frequency converting unit according to the embodiment.

An internal configuration example of the frequency converting unit 460 is explained below with reference to FIG. 8. The frequency converting unit 460 includes a PLL (Phase-Locked Loop) unit 461, a local oscillator 462, a mixer 463, a variable-gain amplifier 464, a SAW (Surface Acoustic Wave) filter 465, and a variable-gain amplifier 466.

The local oscillator 462 generates, on the basis of the control by the PLL unit 461, a local oscillation signal necessary for generating an intermediate frequency signal in the mixer 463 and supplies the local oscillation signal to the mixer 463. The mixer 463 mixes the signal of −15 dBm input from the AGC 450 (see FIG. 6) and the local oscillation signal input from the local oscillator 462 and converts the mixed signals into an intermediate frequency signal.

An output S/N characteristic of the mixer 463 is as shown in FIG. 7. Therefore, when the signal of −15 dBm is input, deterioration in an output signal from the mixer 463 is minimized.

The variable-gain amplifier 464 amplifies the intermediate frequency signal generated by the mixer 463 and outputs the intermediate frequency signal to the SAW filter 465. The SAW filter 465 allows only a frequency band for one channel of an OFDM signal to pass and supplies the signal to the variable-gain amplifier 466. The variable-gain amplifier 466 amplifies the gain of the signal having passed through the SAW filter 465 and outputs the signal to the OFDM demodulation unit 125 (see FIG. 6).

Figure 9:
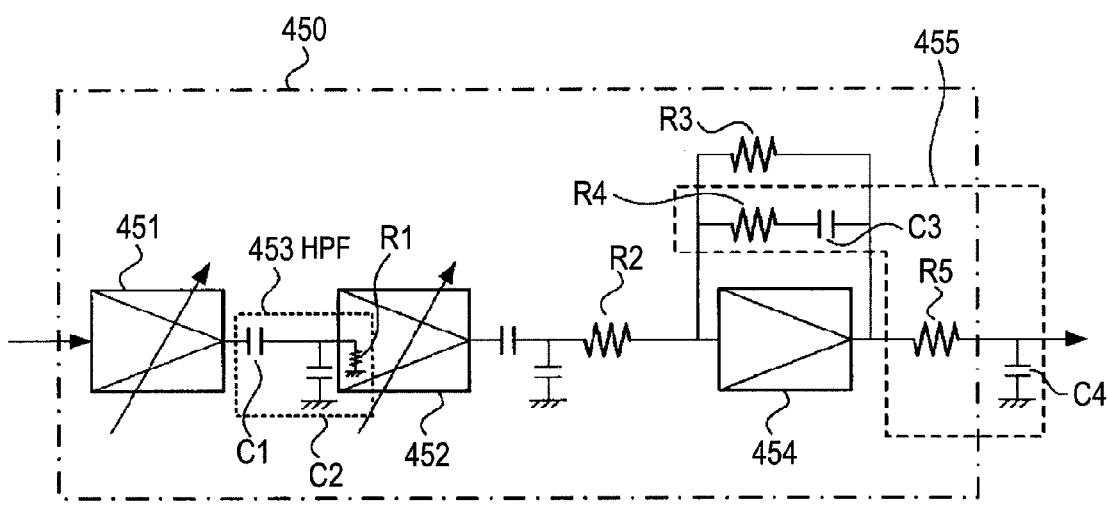
FIG. 9 is a block diagram of an internal configuration example of the AGC according to the embodiment.

A configuration example of an image frequency removal processing section in the AGC 450 in this example is explained below with reference to a block diagram of FIG. 9. In order to secure a wide cover range, the AGC 450 shown in FIG. 9 includes two stages of a variable-gain amplifier 451 and a variable-gain amplifier 452.

The amplifiers are coupled by a capacitor coupling system and a two-stage high-pass filter (HPF) 453 is configured. In the two-stage HPF 453, A capacitor C1 used for the coupling and a resistor R1 as an input resistor in the inside of the variable-gain amplifier 452 configure an HPF in the first stage and a capacitor C2 and the resistor R1 configure an HPF in the second stage.

In order to secure the amplitude of an output signal, an amplifying unit including a resistor R2, a resistor R3, and an amplifier 454 is provided at a post-stage of the variable-gain amplifier 452. A series circuit of a resistor R4 and a capacitor C3 connected in parallel to the resistor R3 and a resistor R5 and a capacitor C4 provided at a post-stage of the amplifier 454 configure a low-pass filter (LPF) 455.

Figure 10:
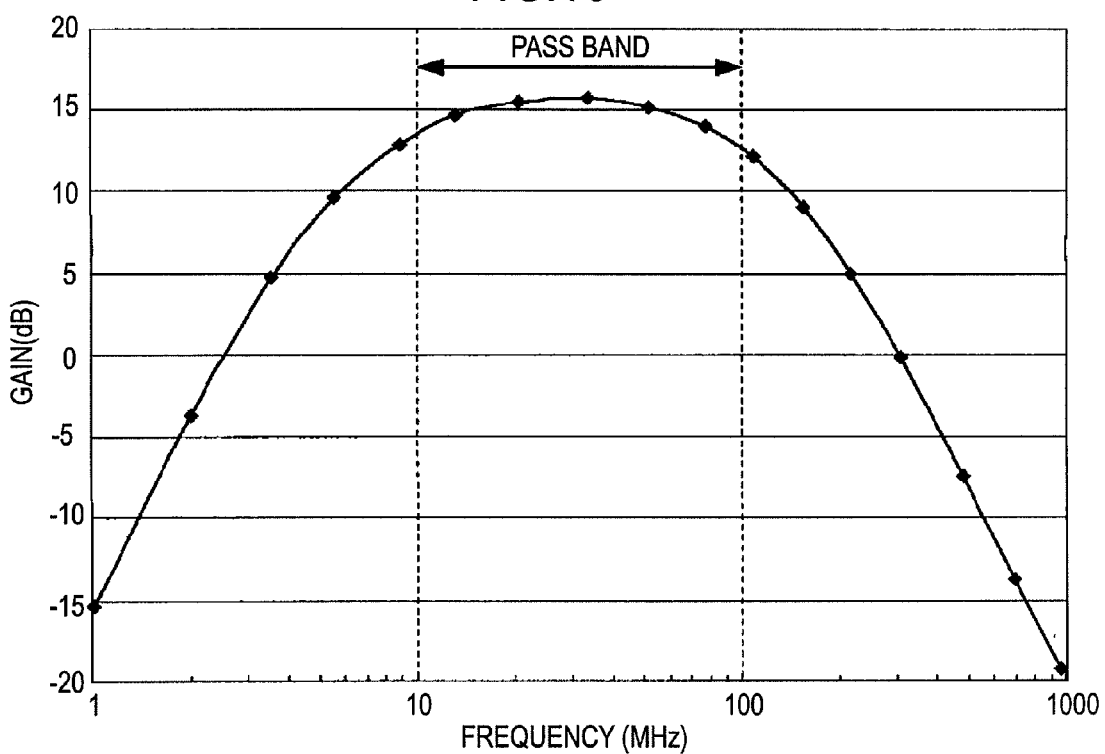
FIG. 10 is a graph of an example of a cut-off characteristic of a BPF according to the embodiment.

Specifically, the two-stage high-pass filter and the LPF 455 configure a band-pass filter (BPF). A pass frequency characteristic in the AGC 450 including such a band-pass filter is shown in FIG. 10. FIG. 10 indicates that the AGC 450 allows signals in a range of 10 MHz to 100 MHz as a desired frequency band to pass and cuts frequencies lower than the range and frequencies higher than the range.

In other words, a function of the band-pass filter is imparted to the AGC 450. This makes it possible to delete an image frequency higher than a reception frequency and extract only a signal component necessary for demodulation.

EFFECTS BY THIS EMBODIMENT

According to the embodiment explained above, when OFDM signals are transmitted between the camera 110 and the control apparatus 120, the plural AMPs corresponding to a signal level are switched to perform level conversion. This makes it possible to compress a fluctuation amount of the signal level, which increases according to an increase in a cable distance, to a signal level range suitable for the OFDM demodulation unit 125.

According to the embodiment, the level of the signal input to the mixer 463 is fixed to a value (in the example explained above, −15 dBm) at which the output S/N of the mixer is the highest. Therefore, compared with the configuration in the past in which signals of frequency bands in a wide range are input to the mixer 463, it is possible to improve the S/N of a demodulated signal (hereinafter also referred to as reception signal) in the OFDM demodulation unit 115 or the OFDM demodulation unit 125 (see FIG. 1).

Figure 11:
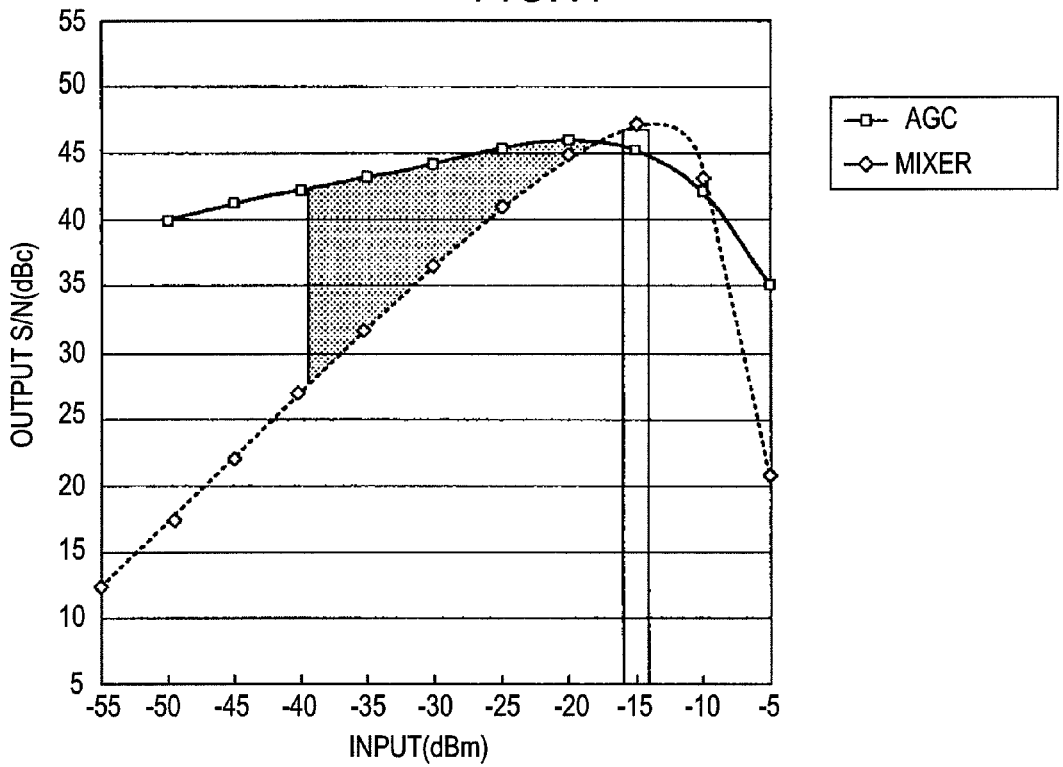
FIG. 11 is a graph of an example of output S/N characteristics of the AGC and the mixer according to the embodiment.

In FIG. 11, an output S/N characteristic of the AGC 450 and an output S/N characteristic of the mixer 463 are shown on one graph. The abscissa of the graph indicates a level (dBm) of an input signal and the ordinate indicates output S/N (dBc). A broken line indicates a characteristic of the mixer 463 and a solid line indicates a characteristic of the AGC 450.

When the AGC 450 in this example is not used, a signal in a range of −39 dBm to −17 dBm output from the step AGC circuit 430 is directly input to the mixer 463. Therefore, when a signal level of a signal input to the mixer 463 is −39 dBm, the output S/N is about 27 dBc.

On the other hand, output S/N of the AGC 450 obtained when the input signal level is −39 dBm increases to about 43 dBc. In other words, when the AGC 450 in this example is used, the output S/N of the mixer 463 is improved in a range indicated by dots in the figure.

Figure 12:
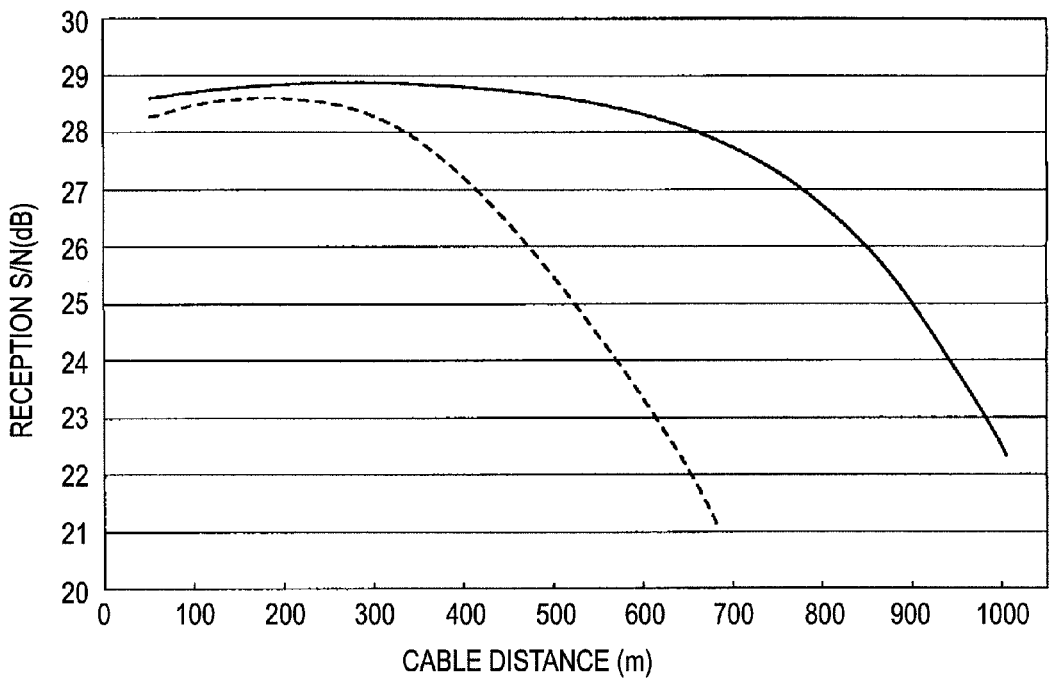
FIG. 12 is a graph of an example of the S/N of a reception signal with respect to fluctuation in the length of a cable.

FIG. 12 is a graph of an S/N characteristic of a signal (a reception signal) after a signal gain-adjusted by the AMP 432 (see FIG. 3) in the step AGC circuit 430, i.e., a signal classified into the short distance level 4321 is demodulated by the OFDM demodulation unit 125. The ordinate indicates S/N (dB) of the reception signal and the abscissa indicates a cable distance (cable length).

The cable length can be replaced with the level of the signal. The signal level is smaller as the cable length is larger. The signal level is larger as the cable length is smaller. A broken line in the figure indicates the S/N of a reception signal in the past and a solid line indicates the S/N of a reception signal in this embodiment.

In the configuration in the past, the S/N of the signal is suddenly deteriorated around the cable length exceeding 250 m. The S/N falls to about 21 dB near 700 m. On the other hand, in the configuration according to this embodiment, S/N of about 28 dB can be maintained even near 700 m.

Therefore, with the camera 100 and the control apparatus 120 according in this example including the step AGC circuit 430 and the AGC 450, since deterioration of a signal caused in a process of transmitting the signal through the communication cable is suppressed, the communication cable length can be extended. Specifically, compared with the configuration in which only the step AGC circuit 430 is provided, the communication cable length can be extended by about several hundreds m.

Since the S/N of the reception signal is improved in this way, the number of errors included in the reception signal is also reduced. It is confirmed that, when the S/N of the reception signal is improved by 1 dB, errors are reduced to about 1/10. Consequently, since sections to be corrected by error correction such as Reed-Solomon or Viterbi are also reduced, deficiencies in a video signal that occur when the error correction does not work can be minimized.

Specifically, it is possible to improve a quality of signal transmission and improve reliability of the video signal transmission system. In particular, when a video signal for a television broadcast is handled, the receiving apparatus according to the embodiment is effective because occurrence of interruption during a broadcast of a video by the video signal is not permitted.

According to this embodiment, a range in which the S/N of the reception signal with respect to a cable length change is high is wider than in the past, even if there is fluctuation in switching accuracy of the step AGC circuit 430, it is possible to prevent deterioration in the S/N.

Figure 13:
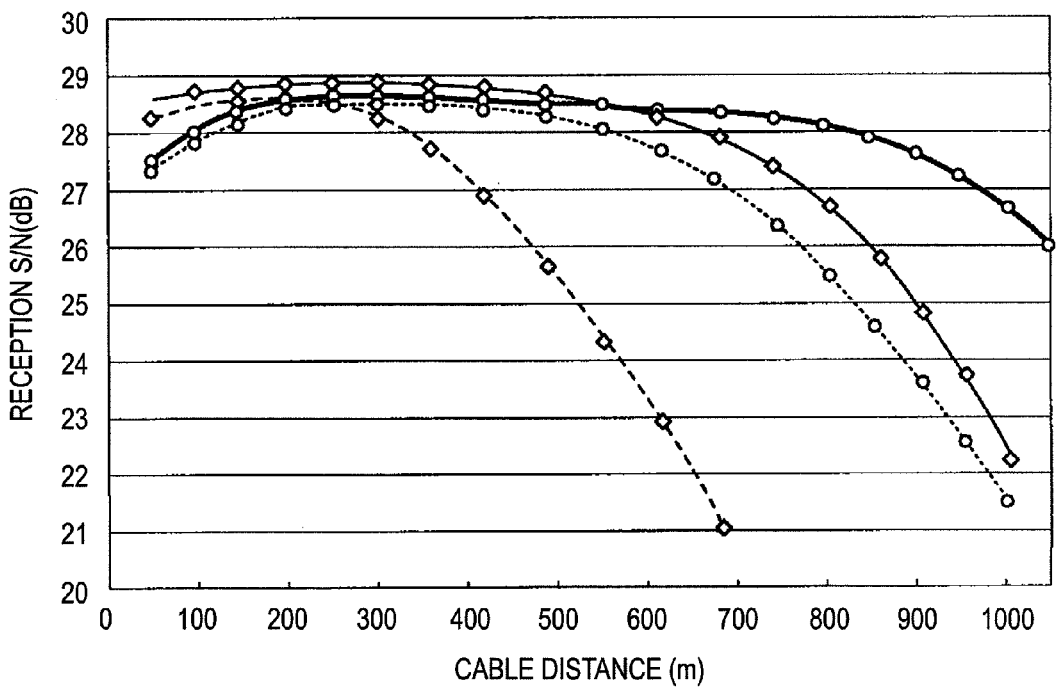
FIG. 13 is a graph of an example of the S/N of the reception signal with respect to the fluctuation in the length of the cable.
Figure 14:
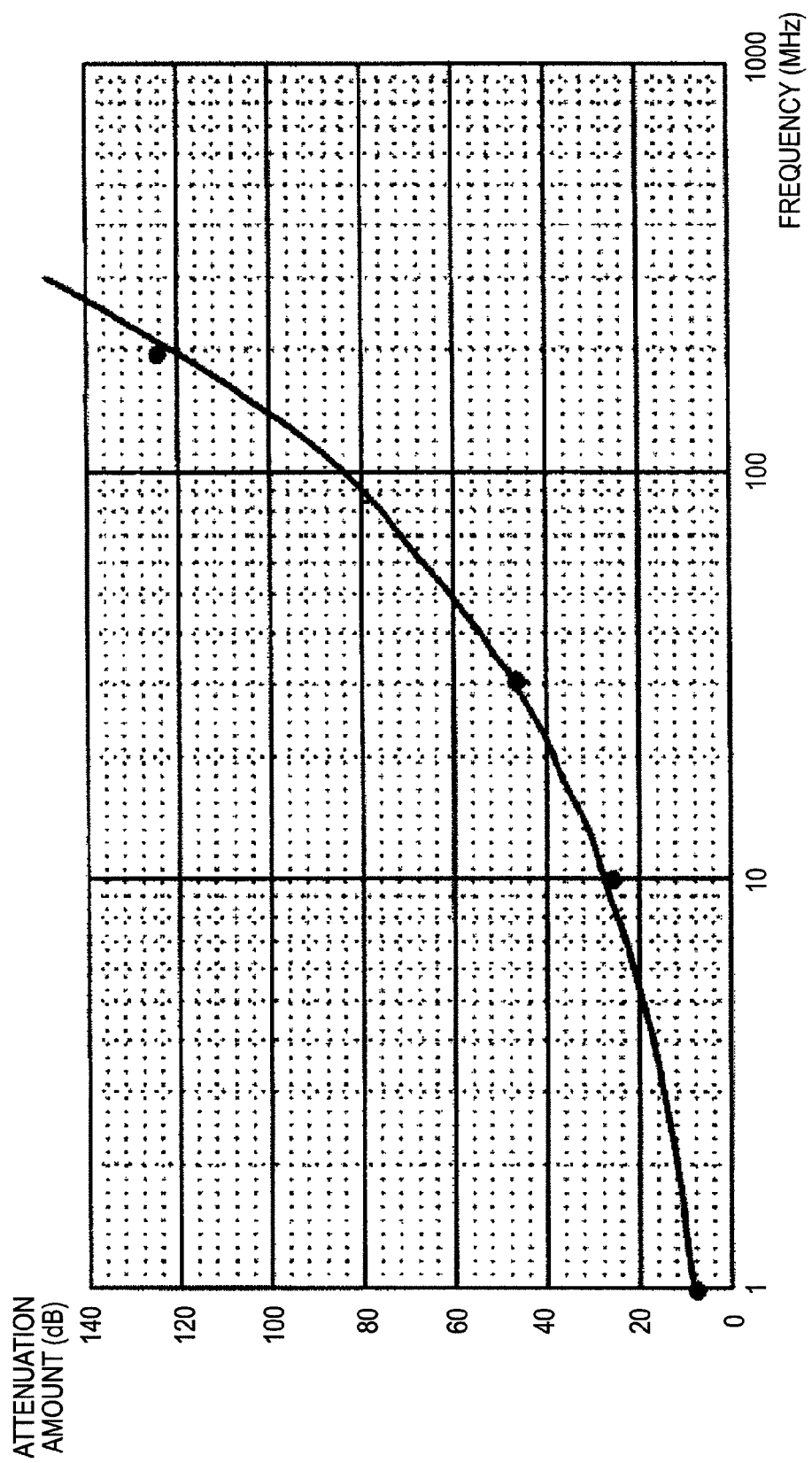
FIG. 14 is a graph of a relation between a frequency and an attenuation amount of a signal in a coaxial cable in the past.
Figure 15:
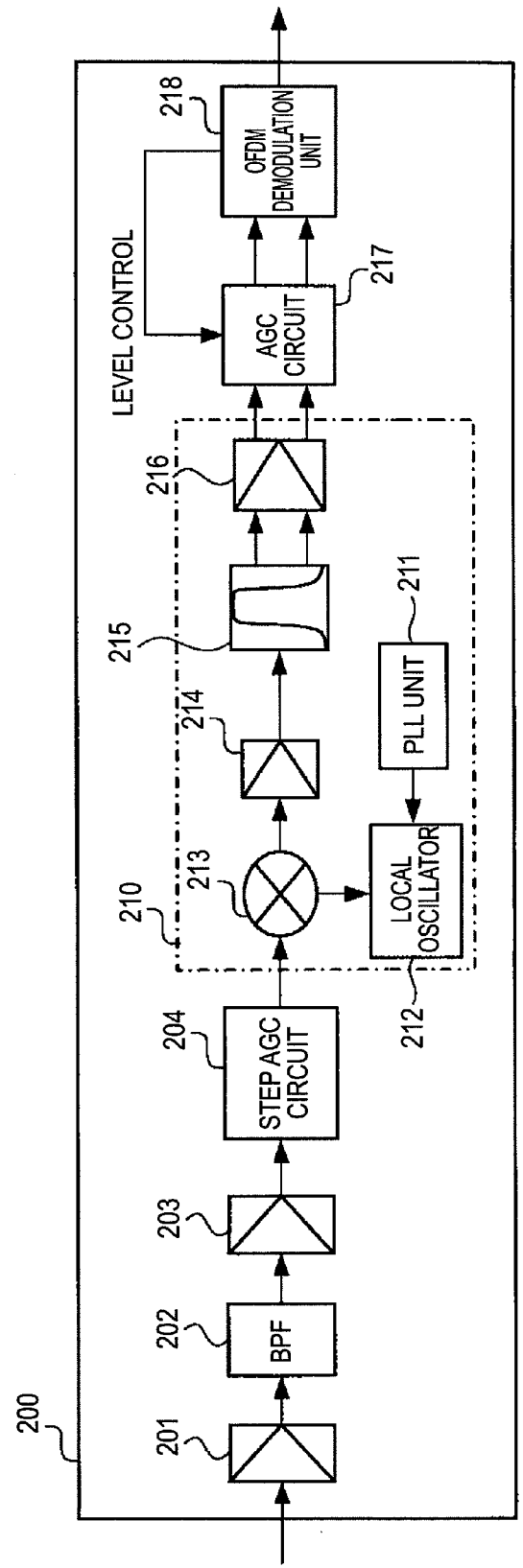
FIG. 15 is a block diagram of an internal configuration example of a TRIAX receiver in the past.
Figure 16A:
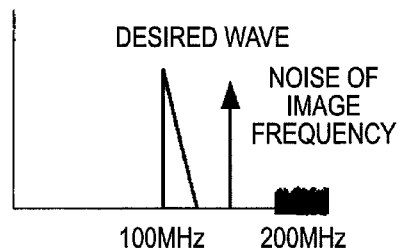
FIGS. 16A and 16B are diagrams of an influence due to an image frequency in the past.
Figure 16B:
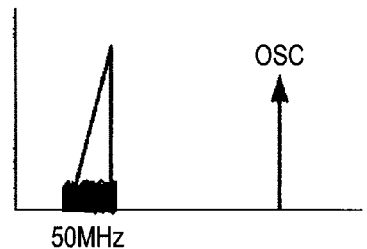
Figure 17:
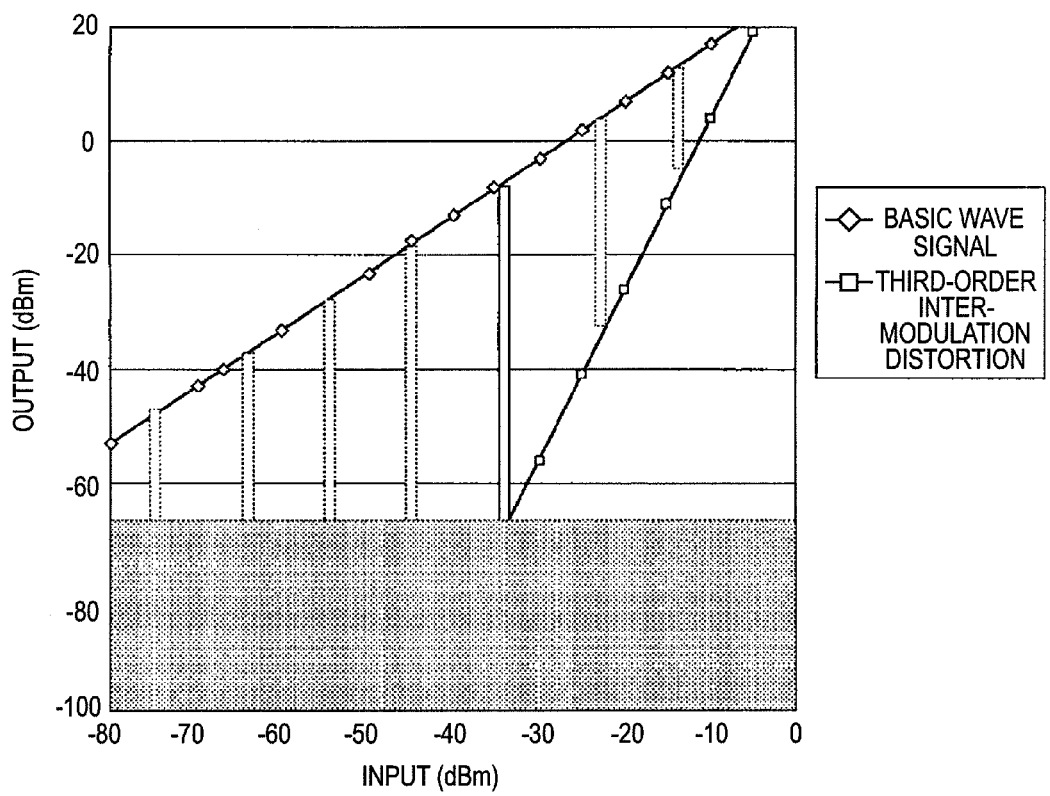
FIG. 17 is a graph of input and output characteristics in an amplifier in the past.
Figure 18:
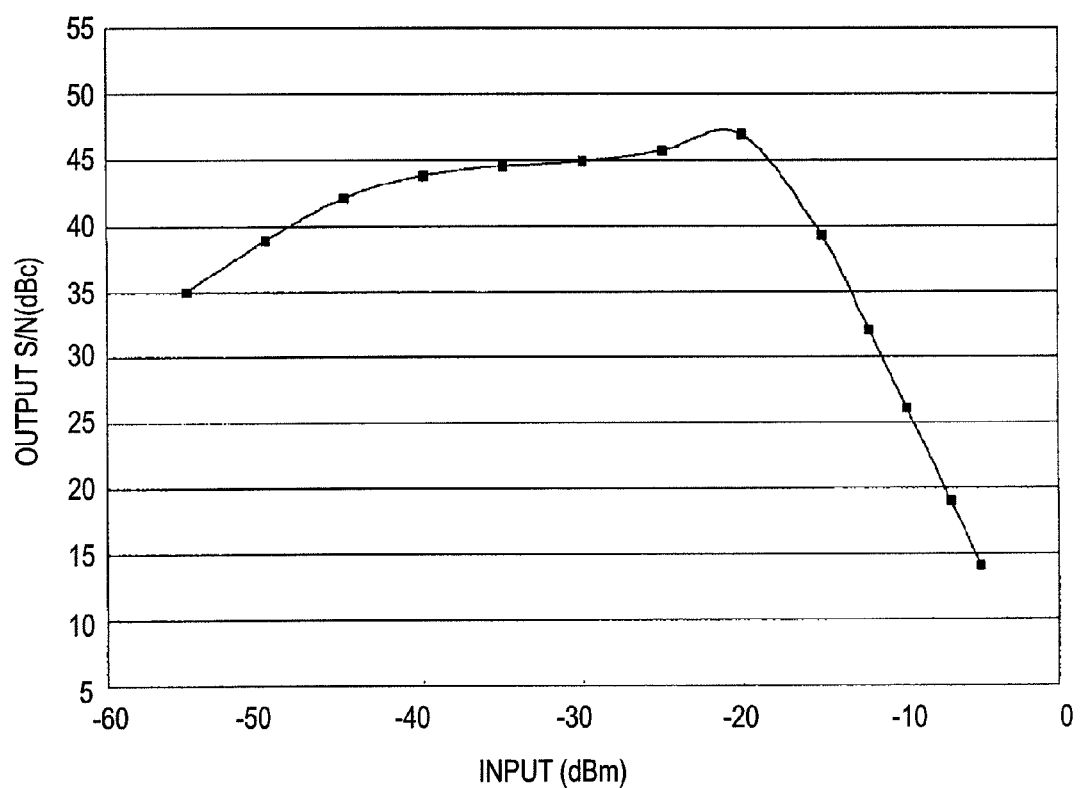
FIG. 18 is a graph of an output S/N characteristic in the amplifier in the past.
Figure 19:
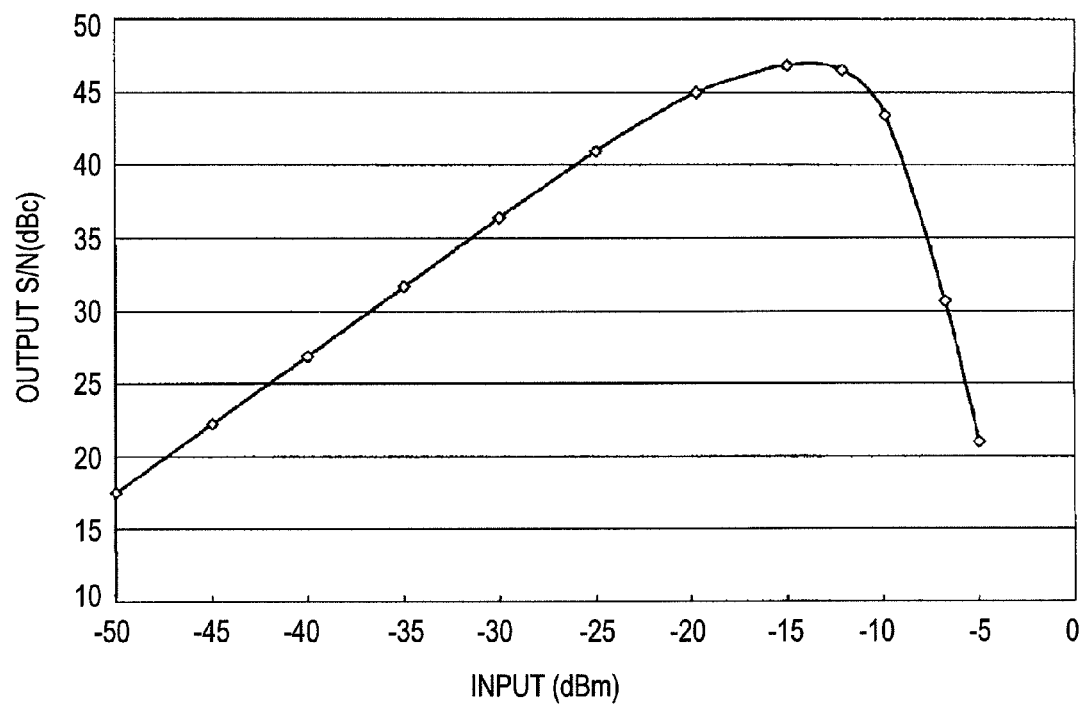
FIG. 19 is a graph of an output S/N characteristic in a mixer in the past.
Figure 20:
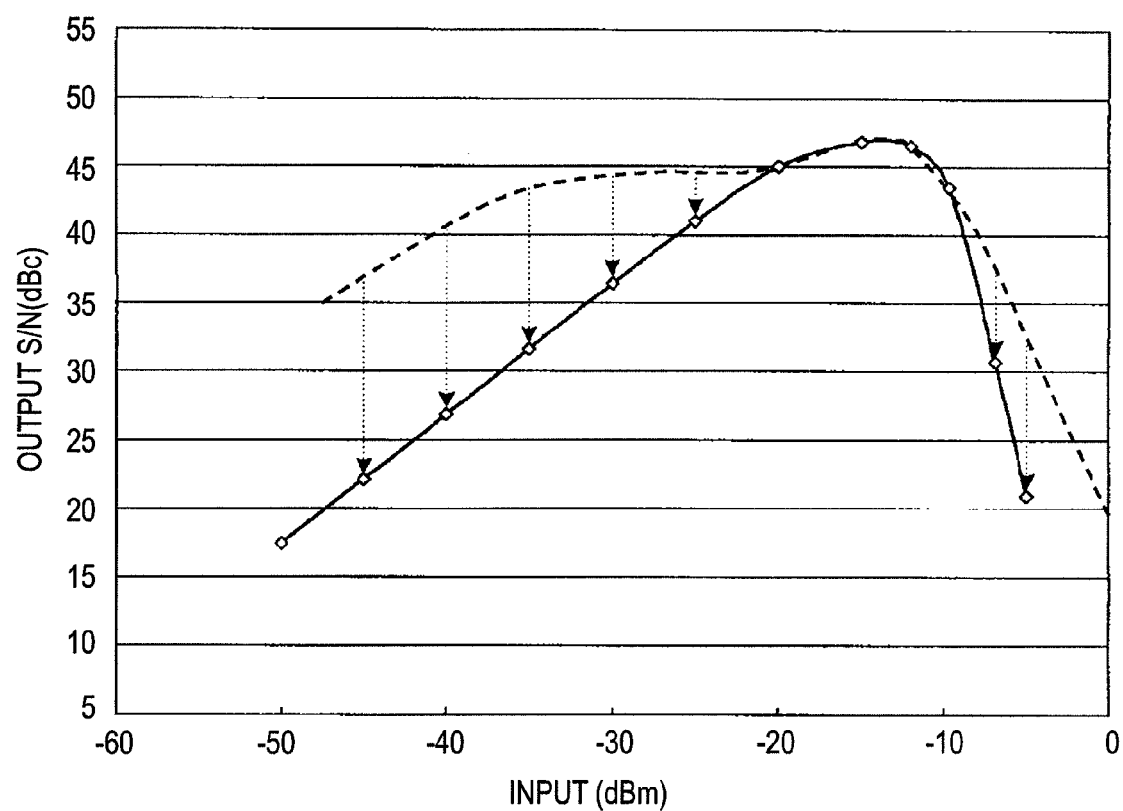
FIG. 20 is a graph of comparison of the output S/N characteristic in the amplifier and the output S/N characteristic in the mixer in the past.

FIG. 13 is a graph of S/N characteristics of a reception signal of the long distance level 4341 gain-adjusted by the AMP 433 (see FIG. 3) and a reception signal of the intermediate distance level 4331 gain-adjusted by the AMP 434.

A scale of the figure is the same as that shown in FIG. 12. A broken line indicates the S/N of a reception signal by the receiving apparatus 200 in the past. A solid line indicates the S/N of a reception signal by the camera 110 or the control apparatus 120 according to the embodiment. The reception signal gain-adjusted by the AMP 433 is indicated by a line plotted by circles. The reception signal gain-adjusted by the AMP 434 is indicated by a line plotted by squares.

In the receiving apparatus in the past, the S/N of the reception signal gain-adjusted by the AMP 434 suddenly falls to about 27 dB at a point of the cable length of 400 m as indicated by the broken line on which square identifiers are arranged. Therefore, to secure the S/N of the reception signal, it is necessary to switch the amplifier from the AMP 434 to the AMP 433 at this point of time. The S/N of the reception signal can be kept at about 28.5 dB by switching the amplifier to the AMP 433.

Conversely, when the switching of the amplifier is not performed at this timing, the S/N of the reception signal is deteriorated.

On the other hand, with the configuration in this example, the S/N of the reception signal gain-adjusted by the AMP 434 is maintained at a high value of about 28.4 dB even at the point of 400 m as indicated by the solid line plotted by squares. This makes it possible to keep the S/N of the reception signal without strictly performing the switching of the amplifier at this point of time.

There is fluctuation in manufacturing of the RSSI detection circuit 439 necessary for the switching of the amplifier. When there is a shift in a value of an RSSI voltage signal depending on a product, a shift also occurs in timing of the switching of the amplifier. However, with the configuration in this example, even if the switching timing for the amplifier is slightly earlier or later, it is possible to keep the S/N of the reception signal at a high level. Therefore, mass-productivity is improved because a request for manufacturing accuracy of the RSSI detection circuit 439 is low.

In this embodiment, since the band-pass filter is incorporated in the AGC 450, the image frequency component is not supplied to the mixer 463. This makes it possible to improve the output S/N of the mixer 463 compared with that obtained when the BPF is not provided. According to an example of an experiment performed by the inventor, improvement of about 3 dB was obtained at the maximum. The S/N of a video signal demodulated by the OFDM demodulation unit 125 was also improved.

In this case, since the BPF is incorporated in the AGC 450, the number of circuit components can also be reduced.

MODIFICATIONS OF THE EMBODIMENT

In the example explained in the embodiment, the signal area of the reception signal is divided into four by the reception-signal processing unit 124 (see FIG. 3). However, the present invention is not limited to this. For example, the signal area may be divided into three, five, or the like.

In the embodiment, the gain of the AMP 431 of the step AGC circuit 430 is set to −12 dB, the gain of the AMP 432 is set to −4 dB, the gain of the AMP 433 is set to +16 dB, and the gain of the AMP 434 is set to +36 dB. However, the present invention is not limited to this. Different gains may be set for the respective AMPs.

In the embodiment, the level of the output signal from the AGC 450 is set to −15 dBm. However, this value is only an example. Other values may be set as the level of the output signal according to the performance of the mixer 463.

In the example explained in the embodiment, the AMP 431, the AMP 432, the AMP 433, and the AMP 434 in the step AGC circuit 430 are connected in parallel. However, the present invention is not limited to this configuration. The AMPS may be connected in cascade or the parallel connection and the cascade connection may be combined.

In the embodiment, the reception-signal processing unit 114 of the camera 110 has the same configuration as the reception-signal processing unit 124 of the control apparatus 120. However, the hold circuit 441 may be removed in the reception-signal processing unit 114 of the camera 110. Since the reception signal of the camera 110 is the camera HD return signal, a serious problem does not occur even when interruption occurs. Therefore, the hold circuit 441 provided to prevent interruption of a signal does not have to be included in the reception-signal processing unit 114.

In the example explained in the embodiment, the gain of the mixer 463 is 0 dB. However, the present invention is not limited to this. For example, when the gain of the mixer 463 is +5 dB or the like, an AGC for adjusting the level of an input signal to the OFDM demodulation unit 125 may be provided at a pre-stage of the OFDM demodulation unit 125.

The present application contains subject matter related to that disclosed in Japanese Priority Patent Application JP 2009-028821 filed in the Japan Patent Office on Feb. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A receiving apparatus comprising
a signal-level detecting unit that detects a signal level of an input signal transmitted through a communication cable;
a first signal-level converting unit including plural amplifiers that are provided for respective predetermined signal level areas obtained by dividing a signal level range of the input signal and amplify or attenuate the input signal with a gain for converting input signals in the signal level areas into a fixed level, the first signal-level converting unit capturing the input signal and converting a signal level of the input signal with any one of the plural amplifiers;
a switching unit that is provided to correspond to the plural amplifiers and switches an output of a signal, a level of which is converted by the plural amplifiers;
a switching control unit that selects a specific amplifier out of the plural amplifiers on the basis of the signal level of the input signal detected by the signal-level detecting unit and controls the switching unit to select an output signal from the selected amplifier;

a band-pass filter that allows only a predetermined frequency band in the signal, the output of which is switched by the switching unit, to pass;

a second signal-level converting unit that converts a signal level of an output signal from the amplifier into a predetermined signal level;

a mixer that mixes the signal having passed through the band-pass filter, the signal level of which is converted by the second signal-level converting unit, and an oscillation signal to generate an intermediate frequency signal; and a demodulating unit that demodulates the intermediate frequency signal generated by the mixer, wherein the predetermined level for the conversion by the second signal-level converting unit is a level of the input signal at which S/N of the mixer is maximized.

2. A receiving apparatus according to claim 1, wherein the band-pass filter is integrated with the second signal-level converting unit.

3. A receiving apparatus according to claim 2, wherein the second level converter includes a first variable-gain amplifier and a second variable-gam amplifier, the band-pass filter includes a low-pass filter that allows a low frequency portion of the input signal to pass and a high-pass filter that allows a high frequency portion of the input signal to pass, and the high-pass filter includes a capacitor that connects the first variable-gain amplifier and the second variable-gain amplifier and an input resistor of the second variable-gain amplifier.

4. A receiving apparatus according to claim 2, wherein, in order to convert input signals in the predetermined signal level areas obtained by dividing the signal level range of the input signal into the fixed level range, for each of the divided input signal level areas, the signal-level converting unit sets, for the input signal level area for a signal level higher than the fixed level range, a gain for attenuating a signal level into the fixed level range and sets, for the input signal level area of a signal level lower than the fixed level range, a gain for amplifying a signal level into the fixed level range.

5. A receiving apparatus according to claim 2, wherein the input signal is an OFDM signal modulated in orthogonal frequency division multiplexing.

6. An imaging apparatus comprising:

a signal-level detecting unit that detects a signal level of a modulated return signal transmitted through a communication cable;

a first signal-level converting unit including plural amplifiers that are provided for respective predetermined signal level areas obtained by dividing a signal level range of the modulated return signal and amplify or attenuate the modulated return signal with a gain for converting input signals in the signal level areas into a fixed level, the first signal-level converting unit capturing, the modulated return signal and converting a signal level of the modulated return signal with any one of the plural amplifiers;

a switching unit that is provided to correspond to the plural amplifiers and switches an output of a signal, a level of which is converted by the plural amplifiers;

a switching control unit that selects a specific amplifier out of the plural amplifiers on the basis of the signal level of the modulated return signal detected by the signal-level detecting unit and controls the switching unit to select an output signal from the selected amplifier;

a band-pass filter that allows only a predetermined frequency band in the signal, the output of which is switched by the switching unit, to pass;

a second signal-level converting unit that converts a signal level of an output signal from the amplifier into a predetermined signal level;

a mixer that mixes the signal having passed through the band-pass filter, the signal level of which is converted by the second signal-level converting unit, and an oscillation signal to generate an intermediate frequency signal; and a demodulating unit that demodulates the intermediate frequency signal generated by the mixer, wherein the predetermined level for the conversion by the second signal-level converting unit is a level of the input signal at which S/N of the mixer is maximized.

7. A receiving method comprising the steps of:

detecting a signal level of an input signal transmitted through a communication cable;

converting the signal level of the input signal with any one of plural amplifiers that are provided for respective predetermined signal level areas obtained by dividing a signal level range of the input signal and amplify or attenuate the input signal with a gain for converting input signals in the signal level areas into a fixed level;

switching an output of a signal, a level of which is converted by the plural amplifiers;

selecting a specific amplifier out of the plural amplifiers on the basis of the detected signal level of the input signal and selecting an output signal from the selected amplifier;

allowing only a predetermined frequency band in the selected output signal to pass;

converting a signal level of an output signal from the amplifier into a predetermined signal level;

mixing the signal including only the predetermined frequency band, the level of which is converted, into the predetermined signal level, and an oscillation signal generated by a local oscillator to generate an intermediate frequency signal; and demodulating the generated intermediate frequency signal, wherein the predetermined level for the conversion is a level of the input signal at which S/N of the mixed signal is maximized.

* * * * *